United States Patent [19]

Kim

[11] Patent Number: 5,818,363

[45] Date of Patent: Oct. 6, 1998

[54] RUNLENGTH CODING APPARATUS FOR USE IN A VIDEO SIGNAL ENCODING SYSTEM

[75] Inventor: Jong-Han Kim, Seoul, Rep. of Korea

[73] Assignee: Daewoo Electronics Co., Ltd., Seoul, Rep. of Korea

[21] Appl. No.: 876,281

[22] Filed: Jun. 16, 1997

[30] Foreign Application Priority Data

Jun. 14, 1996 [KR] Rep. of Korea .................. 1996 21442
Jun. 14, 1996 [KR] Rep. of Korea .................. 1996 21443

[51] Int. Cl.$^6$ ...................................................... H03M 7/46
[52] U.S. Cl. .............................................. 341/63; 341/59
[58] Field of Search ........................ 341/63, 59; 348/426; 358/261.1

[56] References Cited

U.S. PATENT DOCUMENTS 5,668,547 9/1997 Lee ............................................. 341/63

*Primary Examiner*—Brian K. Young
*Attorney, Agent, or Firm*—Pennie & Edmonds LLP

[57] ABSTRACT

A runlength coding apparatus converts an input data stream including a plurality of zeros and non-zero values to a runlength coded signal. The apparatus has an input buffer, a runlength detector, and a level detector. First, the input buffer generates a first and a second sequences of the input data stream. The runlength detector provides runlengths based on the first and the second sequences, and generates indicating signals by checking whether each of elements in the first and the second sequences is zero. Meanwhile, the level detector supplies levels based on the indicating signals and the first and the second sequences. The detected runlengths and levels are combined a multiplicity of run-level pairs and provided as the runlength coded signal.

17 Claims, 7 Drawing Sheets

RUNLENGTH CODING APPARATUS FOR USE IN A VIDEO SIGNAL ENCODING SYSTEM

FIELD OF THE INVENTION

The present invention relates to an apparatus for encoding a digital video signal; and, more particularly, to an improved runlength coding apparatus for use in a video signal encoding system.

DESCRIPTION OF THE PRIOR ART

As is well known, transmission of digitized video signals can help attain, at the receiving end, video images of a much higher quality than the transmission of analog signals. When an image signal is expressed in a digital form, a substantial amount of data is generated for transmission, especially in the case of a high definition television (HDTV) system. Since, however, the available frequency bandwidth of a conventional transmission channel is limited, in order to transmit the substantial amounts of digital data therethrough, it is inevitable to compress or reduce the volume of the transmission data.

In a modern video image transmission or processing system, a digital video signal may be coded by first obtaining a discrete cosine transform (DCT) of a block of pixels. The DCT, which reduces or removes spatial redundancies between frames of image data, converts a block of digital image data of N×N pixels into a set of transform coefficient data having one DC coefficient and (N×N−1) number of AC coefficients, N being a positive integer. The set of transform coefficient data is quantized to a set of quantized transform coefficients data so as to take advantage of the occurrence of "zeros" and then zigzag scanned, thereby generating a stream of image data having a plurality of zeros and non-zero values. Thereafter, the data stream is subjected to a runlength coding to exploit runs of zeros in this data stream.

As shown in FIG. 1, a conventional apparatus employing the runlength coding comprises a first buffer 11, a zero value detector 12, a counter 13 and a second buffer 14. The first buffer 11 temporarily stores the data stream and sequentially supplies it to the zero value detector 12 and the second buffer 14 in parallel. The zero value detector 12 checks whether an element of the data stream fed thereto is zero or not and outputs the result to the counter 13 and the second buffer 14 as a control signal. The counter 13 counts the number of elements of the data stream detected as zero at the zero value detector 12 and outputs the number as a runlength under the instructions of the control signal. In response to the control signal from the zero value detector 12, the second buffer 14 outputs a non-zero value of the data stream as a level corresponding to the runlength retrieved from the counter 13, Consequently, the data stream is converted into a multiplicity of run-level pairs, each of the run-level pairs including a runlength and a corresponding level, wherein the runlength represents the number of zeros in a run of continuous zeros preceding a non-zero value and the level indicates the magnitude of the non-zero value following the run of continuous zeros.

Since, however, the conventional apparatus processes each element in the data stream in a series fashion, it takes time to process the data and, therefore, it remains desirable to develop an apparatus for further enhancing the data processing speed.

SUMMARY OF THE INVENTION

It is, therefore, a primary object of the invention to provide a runlength coding method and apparatus capable of converting at an improved speed an input data stream to a runlength coded signal by processing two transform coefficients of the input data stream at a same time.

In accordance with the present invention, there is provided a runlength coding apparatus for encoding a stream of input data to generate a runlength coded signal, wherein the input data stream includes a plurality of zeros and non-zero values, which comprises: a buffer for generating a first and a second sequences of the input data stream, the first and the second sequences including all of odd-numbered sequential data and all of even-numbered sequential data in the input data stream, respectively; a runlength detector for providing runlengths based on the first and the second sequences and generating indicating signals by checking whether each of elements in the first and the second sequences is zero, wherein each runlength represents the number of zeros in a run of continuous zeros preceding a non-zero value in the input data stream; a level detector for supplying levels based on the indicating signals and the first and the second sequences, wherein each level depicts the magnitude of the non-zero value following the run of continuous zeros in the input data stream; and a providing unit for supplying a multiplicity of run-level pairs as the runlength coded signal based on the runlengths and levels.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
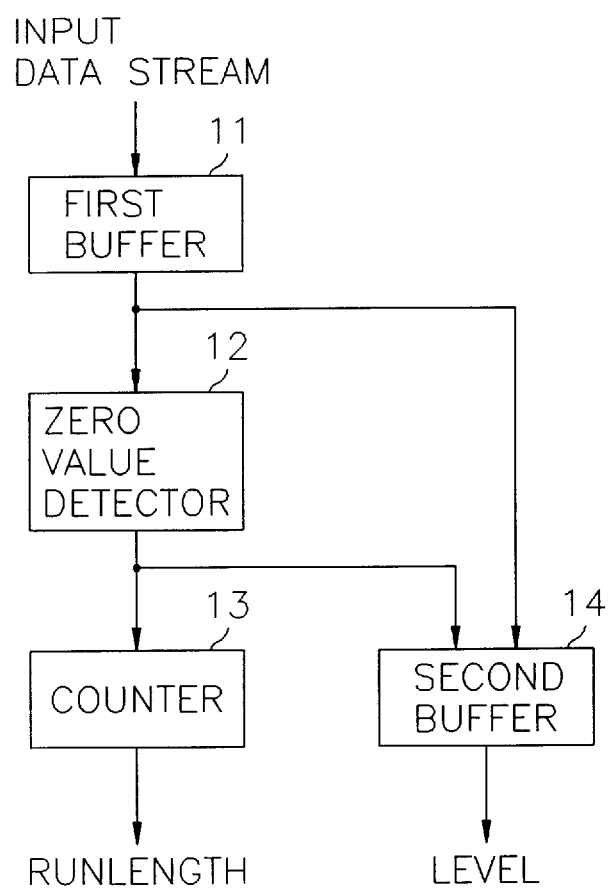
FIG. 1 shows a schematic block diagram of a conventional runlength coding apparatus.
Figure 2:
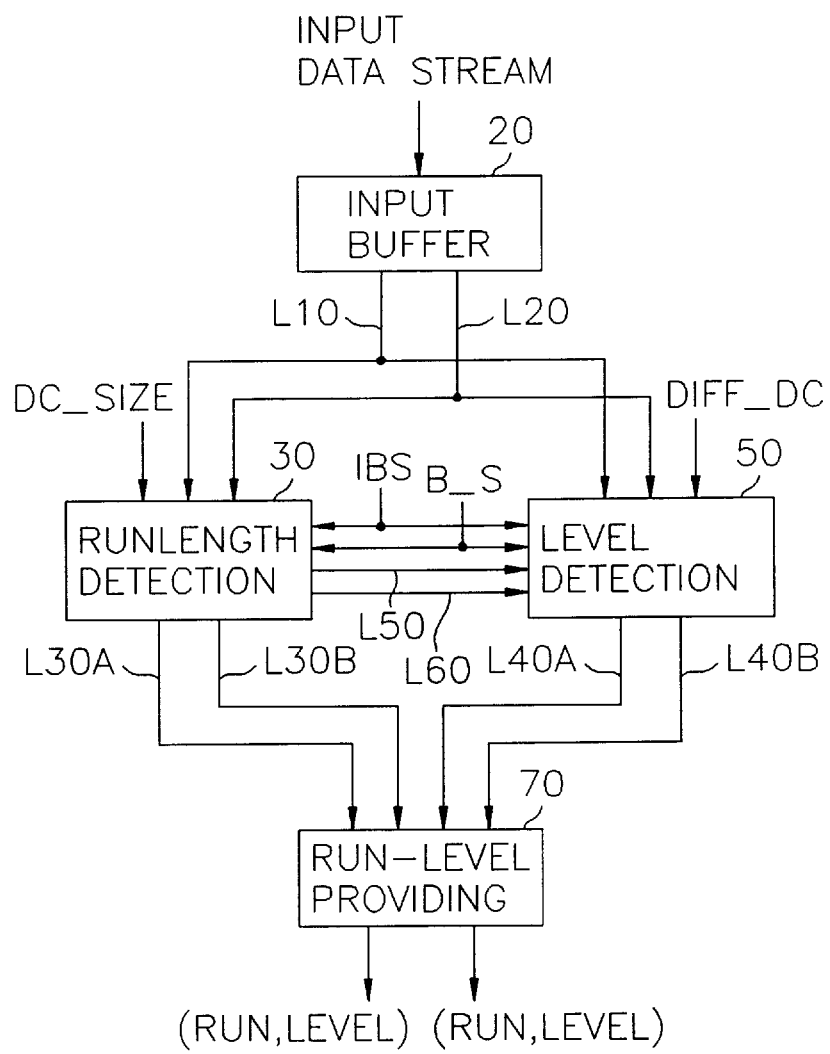
FIG. 2 depicts a schematic block diagram of a runlength coding apparatus in accordance with the present invention.

Referring to FIG. 2, there is shown a runlength coding apparatus in accordance with a preferred embodiment of the present invention. The runlength coding apparatus 500 encodes an input data stream to provide a runlength coded signal, wherein the input data stream is in a form of a set of quantized transform coefficient data and, therefore, includes a plurality of zeros and non-zero values.

The input data stream is fed to an input buffer 20 for a rearrangement and temporary storage thereof. At the input buffer 20, the input data stream coupled thereto is classified into an odd sequence SEQ1 and an even sequence SEQ2 of the input data stream, wherein the odd sequence SEQ1 includes all of odd-numbered sequential data, i.e., 1st, 3rd, 5th, . . . , of the input data stream and the even sequence SEQ2 has all of even-numbered sequential data, i.e., 2nd, 4th, . . . , of the input data stream. The sequences SEQ1 and SEQ2 are provided to a runlength detection unit 30 and a level detection unit 50 via respective lines L10 and L20. In response to an intra block signal IBS and a block starting signal B_S, the runlength detection unit 30 outputs two runlengths through lines L30A and L30B based on the SEQ1 and SEQ2, respectively, while the level detection unit 50 derives two levels via lines L40A and L40B by using the SEQ1 and SEQ2, respectively, at a same clock cycle, wherein each runlength represents the number of zeros in a run of continuous zeros preceding a non-zero value in the input data stream and each level depicts the magnitude of the non-zero value following the run of continuous zeros in the input data stream. In the above, the intra block signal IBS represents whether the input data stream includes a set of quantized transform coefficient data of an intra block and the block starting signal B_S is generated when a new set of quantized transform coefficient data is fed to the runlength coding apparatus 500 as the input data stream. The detected runlengths and levels are respectively combined at a run-level providing unit 70 to generate a multiplicity of run-level pairs as the runlength coded signal.

Hereinafter, with reference to FIGS. 3 to 7, the runlength detection unit 30 and the level detection unit 50 will be respectively explained.

Figure 3:
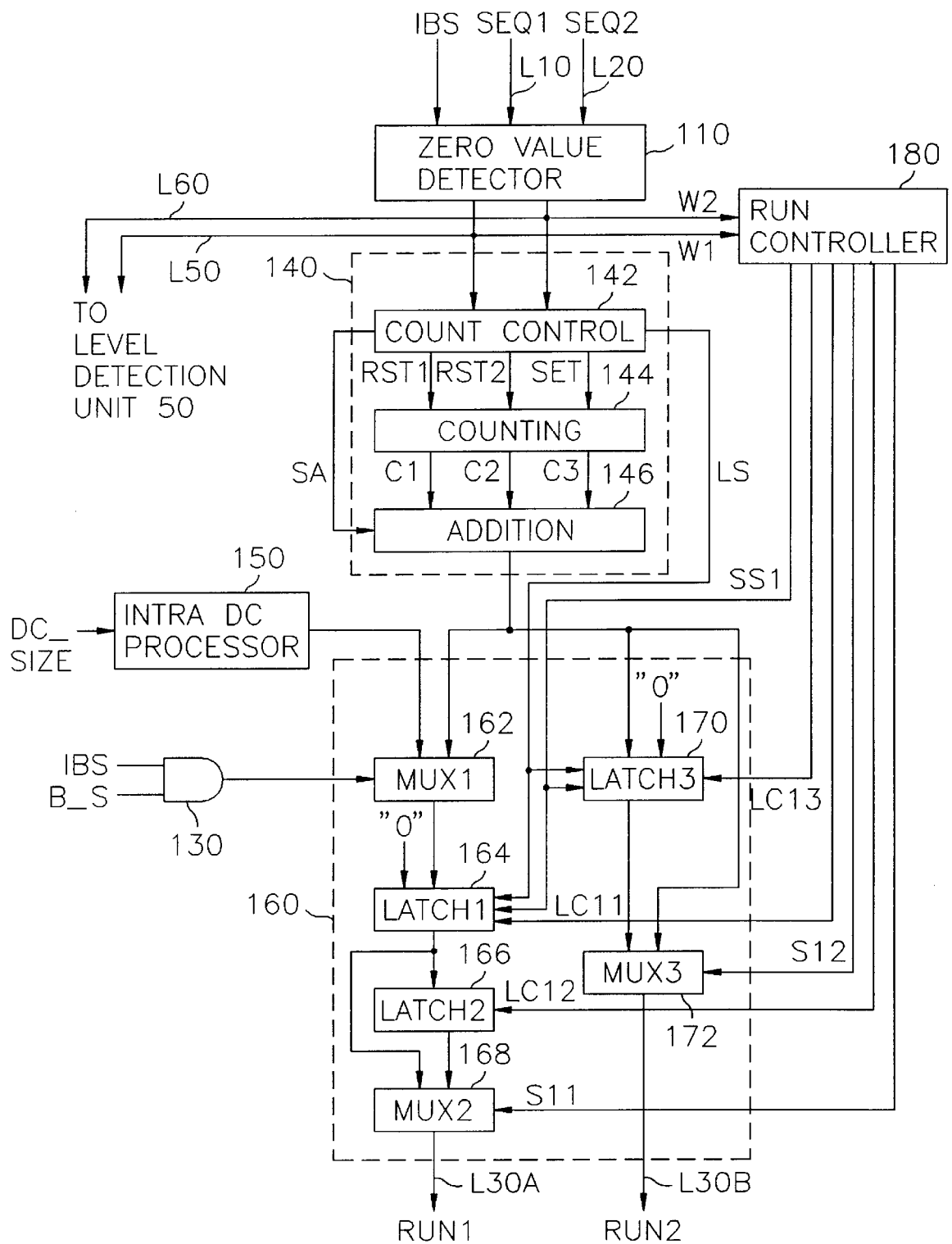
FIG. 3 is a block diagram of a runlength detection unit in FIG. 2.

First of all, in FIG. 3, there is provided a block diagram of the runlength detection unit 30 containing a zero value detector 110, a run value calculator 140, an intra DC processor 150, a runlength provider 160, a run controller 180, and a control gate 130.

The zero value detector 110 produces a first and a second write signals W1 and W2 by checking whether each element of the sequences SEQ1 and SEQ2 respectively coupled thereto via lines L10 and L20 is zero or not. In more detail, the zero value detector 110 generates the first write signal W1 having a logic high, i.e., a digit 1 whenever each element of the SEQ1 is detected as an intra DC coefficient, wherein the intra DC coefficient is recognized by the intra block signal IBS fed to the zero value detector 110. Meanwhile, in a case an element of the SEQ1 is not an intra DC coefficient, the first write signal W1 has a digit 1 if the element of the SEQ1 is not zero value, and if otherwise, it has a logic low, i.e., a digit 0. In a similar fashion, the zero value detector 110 produces the second write signal W2 having a digit 1 when an element of the SEQ2 is not zero value and a digit 0 if otherwise. The respective write signals W1 and W2 having either a digit 1 or 0 are provided from the zero value detector 110 to the run value calculator 140, the run controller 180, and the level detection unit 50 via lines L50 and L60, respectively.

The run value calculator 140 sequentially ciphers a run value based on the write signals W1 and W2 and outputs the run value to the runlength provider 160. As described in FIG. 3, the run value calculator 140 contains a count control sector 142, a counting sector 144, and an addition sector 146. The count control sector 142 produces control signals RST1, RST2, SET, SA, and LS as shown in [Table 1] based on the write signals W1 and W2 for properly controlling connected devices.

TABLE 1

| W1 | W2 | RST1 | RST2 | SET | SA | LS |
|----|----|------|------|-----|----|----|
| 0 | 0 | 0 | 0 | 0 | 0 | 0 |
| 0 | 1 | 1 | 1 | 0 | 1 | 0 |
| 1 | 0 | 1 | 0 | 1 | 0 | 0 |
| 1 | 1 | 1 | 1 | 0 | 0 | 1 |

Figure 4:
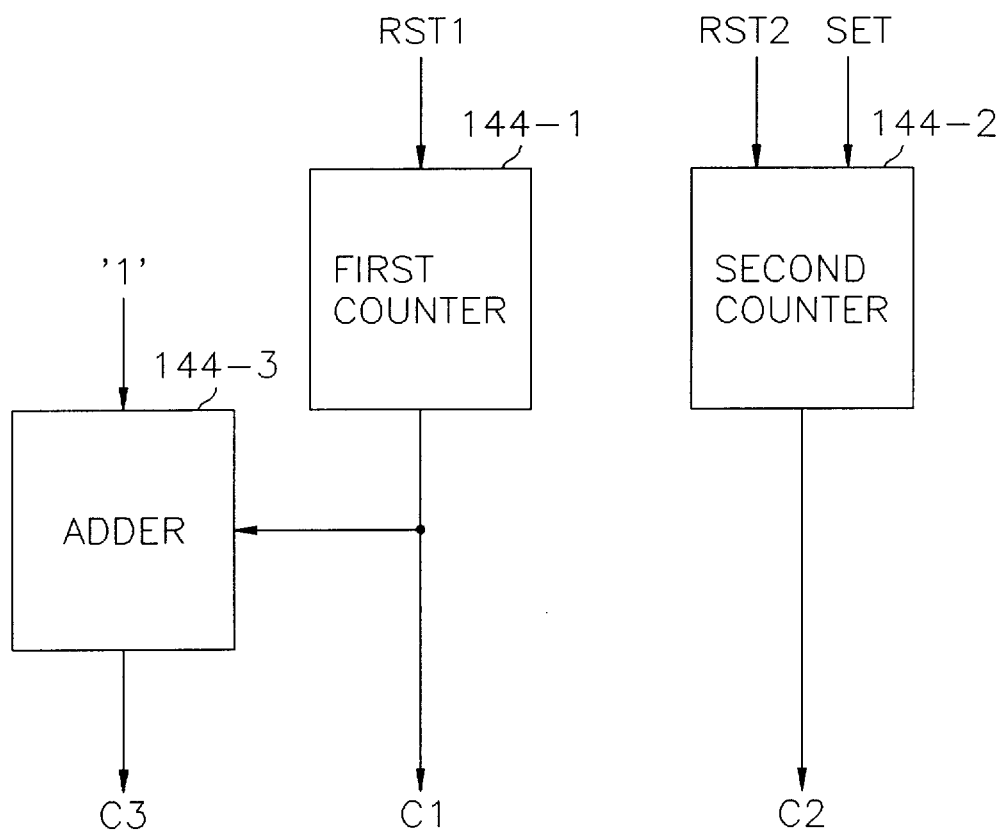
FIG. 4 represents a detailed block diagram of a counting sector in FIG. 3.

According to the above control signals RST1, RST2, and SET, the counting sector 144 provides counted values C1, C2, and C3 to the addition sector 146. Referring to FIG. 4, there is shown a detailed block diagram of the counting sector 144 containing a first and a second counters 144-1 and 144-2 and an adder 144-3. The first counter 144-1 outputs the first counted value C1 incremented by one if the RST1 signal is a digit 0, and is reset if the RST1 signal is a digit 1. The second counter 144-2 provides the second counted value C2 incremented by one if the RST2 and SET signals have an identical digit 0; is reset to zero if the RST2 signal is a digit 1; and is set to one if the SET signal is a digit 1. The adder 144-3 ciphers the third counted value C3 by adding one to the first counted value C1.

Referring back to FIG. 3, the addition sector 146 supplies, in response to the control signal SA from the count control sector 142, either a sum of the counted values C1 and C2 or that of the counted values C1 and C3 as a run value. That is, if the SA signal has a digit 1, the sum of the C1 and C3 is outputted as a run value, and the sum of the C1 and C2 is provided as a run value if the SA signal has a digit 0. Each run value sequentially outputted from the addition sector 146 in the run value calculator 140 is transferred to the runlength provider 160.

In the meantime, the intra DC processor 150 converts the size of an intra DC coefficient, DC_SIZE, i.e., the number of bits assigned to represent the intra DC coefficient, in a bit form corresponding to the number of bits assigned to describe a runlength, and transfers it to the runlength provider 160 as a DC size.

Figure 5:
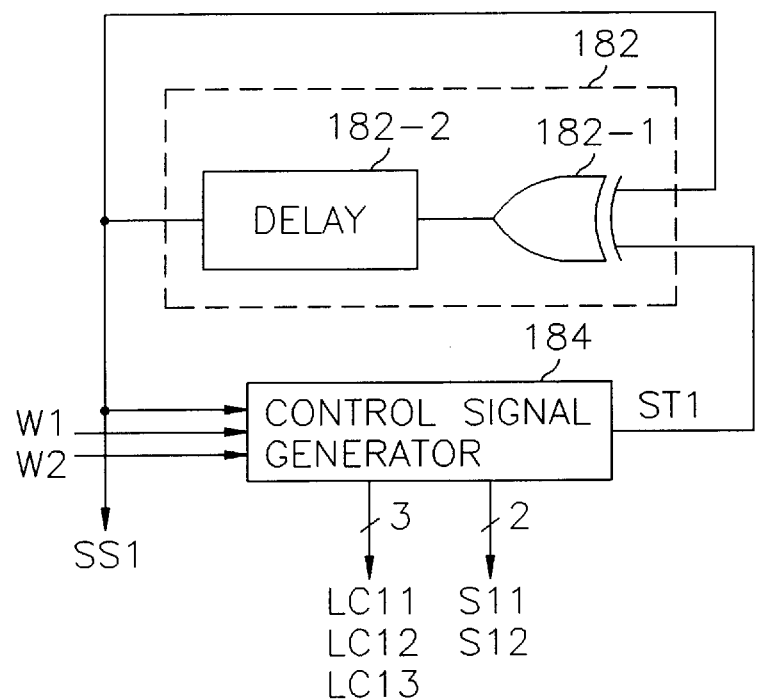
FIG. 5 presents a detailed block diagram of a run controller in FIG. 3.
Figure 6:
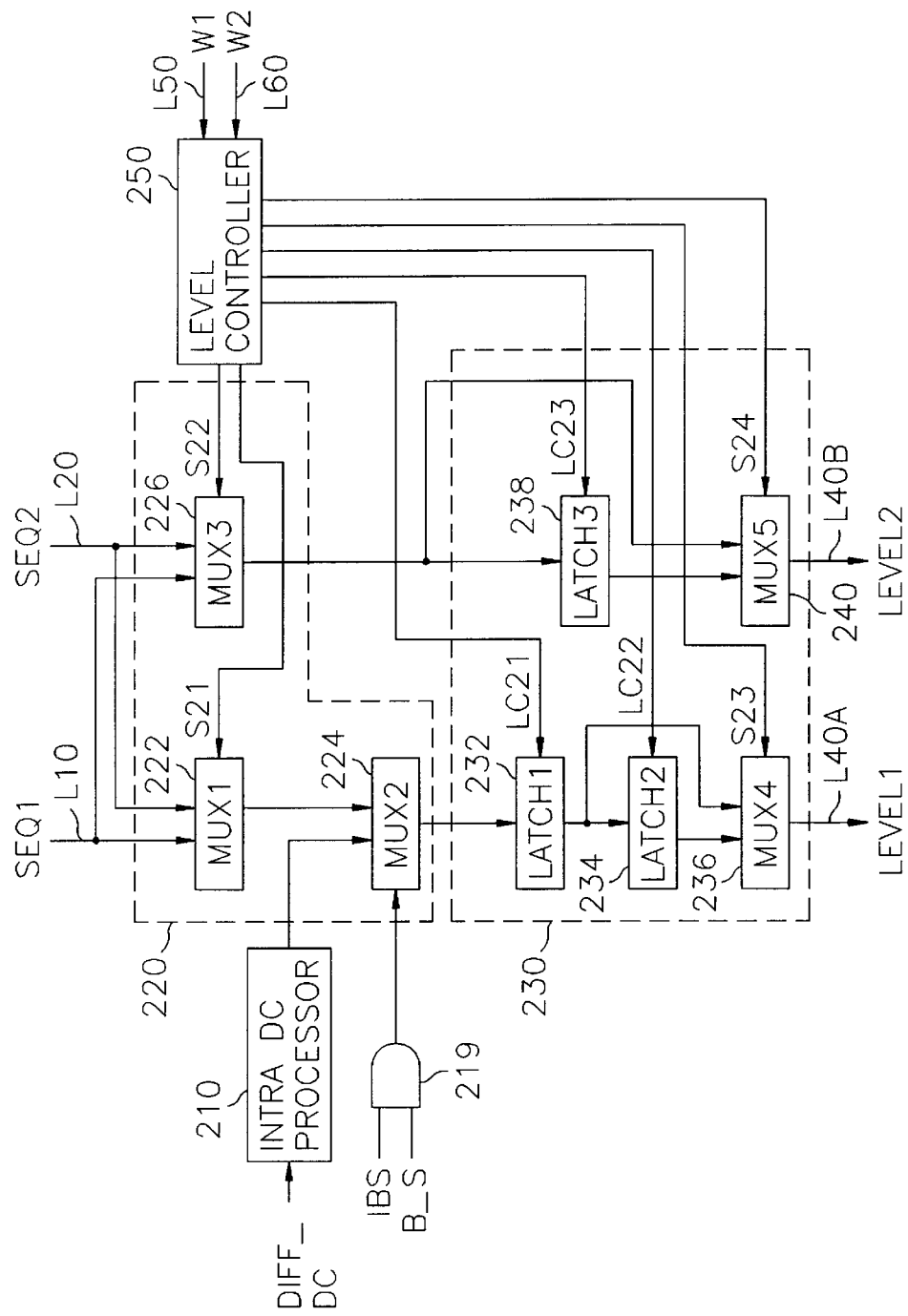
FIG. 6 provides a block diagram of a level detection unit in FIG. 2.

During the above processes, the run controller 180 generates latch control signals LC11, LC12 and LC13, selection control signals S11 and S12, and a stage signal SS1 based on the write signals W1 and W2 from the zero value detector 110 so as to effectively control the runlength provider 160. In FIG. 5, there is shown an exemplary block diagram of the run controller 160 having a stage signal producer 182 and a control signal generator 184. The stage signal producer 182 logically combines a previous stage signal SS1' fed back thereto and a toggle signal ST1 by using an exclusive-OR gate 182-1 and delays the output of the exclusive-OR gate 182-1 for a predetermined number of clock cycles, e.g., one clock cycle, via a delay circuit 182-2 to thereby produce the stage signal SS1. The control signal generator 184 outputs the control signals LC11, LC12, LC13, S11 and S12, and the toggle signal ST1 by using the stage signal SS1 and the write signals W1 and w2. The signals derived at the run controller 180 have states as shown in [Table 2].

TABLE 2

| SS1 | W1 | W2 | LC11 | LC12 | LC13 | S11 | S12 | ST1 |
|-----|----|----|------|------|------|-----|-----|-----|
| 0 | 0 | 0 | — | 1 | — | 1 | 0 | 0 |
| 0 | 0 | 1 | 1 | 1 | — | — | 0 | 1 |
| 0 | 1 | 0 | 1 | 1 | — | — | 0 | 1 |
| 0 | 1 | 1 | 1 | 1 | 0 | 1 | 0 | 0 |
| 1 | 0 | 0 | 0 | 1 | — | — | 0 | 0 |
| 1 | 0 | 1 | 0 | 1 | 1 | 1 | 0 | 1 |
| 1 | 1 | 0 | 0 | 1 | 1 | 1 | 0 | 1 |
| 1 | 1 | 1 | 0 | 1 | 1 | 0 | 1 | 0 |

In the [Table 2], "-" indicates the absence of a corresponding control signal. It is preferable that the control signal generator 184 is embodied by a programmable logic array (PLA).

The runlength provider 160 in FIG. 3 provides two runlengths RUN1 and RUN2 via lines L30A and L30B, respectively, in a same clock cycle based on each run value sequentially coupled from the run value calculator 140 and the DC size delivered from the intra DC processor 150 under the control of the control signals from the run controller 190; and, particularly, provides the DC size as a first runlength of the input data stream. The runlength provider 160 contains three number of multiplexors and three number of latches.

A first multiplexor 162 supplies, in response to a selection signal which is an output of the control gate 130 having the intra block signal IBS and the block starting signal B_S as its inputs, either the DC size or a run value from the run value calculator 140 to a first latch 164. That is to say, if the selection signal from the logic gate 130 has a digit 1, the DC size is selected and the run value from the run value calculator 140 is chosen if otherwise.

The first latch 164 latches and outputs the value retrieved from the first multiplexor 162 in response to the first latch control signal LC11 having a digit 1. On the other hand, if the control signals LC11, SS1, and LS have digits 0, 1, and 1, respectively, the latch 164 loads and outputs zero. The output of the first latch 164 is provided to a second latch 166 and a second multiplexor 168 in parallel.

The second latch 166 latches and outputs, in response to the second latch control signal LC12 always having a digit 1 as shown in [Table 2], the output of the first latch 164 to the second multiplexor 168.

The second multiplexor 168 selectively provides, in response to the selection control signal S11, either the output of the first latch 164 or that of the second latch 166 as a runlength via the line L30A. That is, if both W1 and W2 are Referring to FIG. 6, there is shown a block diagram of the level detection unit 50 in FIG. 2 having an intra DC processor 210, a data input circuit 220, a level provider 230, a level controller 250, and a control gate 219.

The intra DC processor 210 converts a differential DC coefficient, DIFF_DC, which is a difference between intra DC coefficients of two succeeding sets of transform coefficient data, in a form corresponding to a bit form representing each level and provides it to the data input circuit 220 as a differential DC value.

The control gate 219 generates a selection signal based on the intra block signal IBS and the block starting signal B_S and then provides the selection signal to the data input circuit 220.

Figure 7:
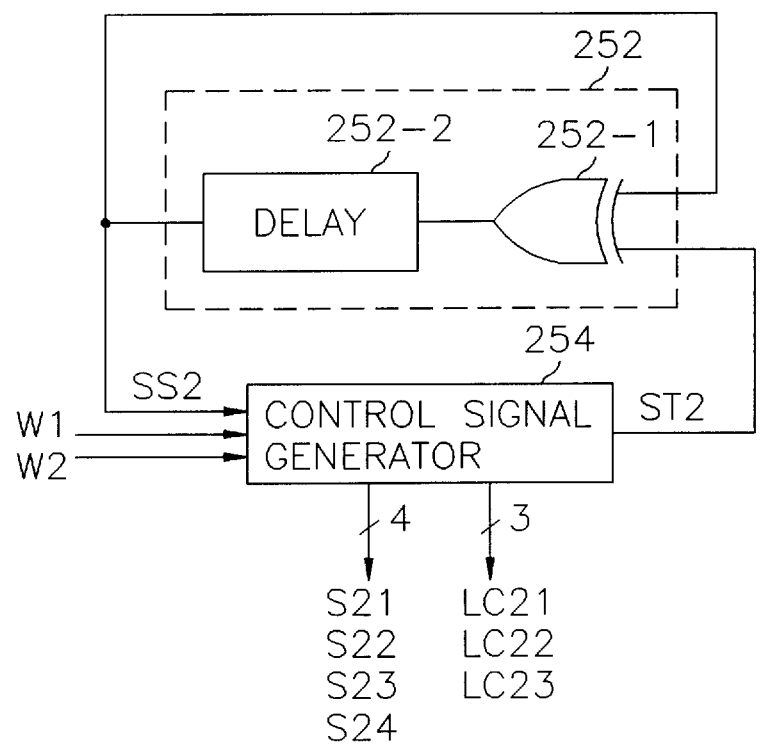
FIG. 7 illustrates a detailed block diagram of a level controller in FIG. 6.

In FIG. 7, there is shown a diagram of the level controller 250, which includes a stage signal producer 252 and a control signal generator 254. The stage signal producer 252 generates a stage signal SS2 by using the similar circuit to the stage producer 182 in the run controller 180, which uses a previous stage signal SS2' fed back thereto and a toggle signal ST2 retrieved from the control signal generator 254 as its inputs. The control signal generator 254 produces selection control signals S21, S22, S23 and S24, latch control signals L21, L22 and L23, and the toggle signal ST2 based on the write signals W1 and W2 through the lines L50 and L60, respectively, transferred from the runlength detection unit 30 and the stage signal SS2. Each of the control signals is determined as shown in [Table 3].

TABLE 3

| SS2 | W1 | W2 | LC21 | LC22 | LC23 | S21 | S22 | S23 | S24 | ST2 |
|---|---|---|---|---|---|---|---|---|---|---|
| 0 | 0 | 0 | — | 1 | — | — | — | 1 | 0 | 0 |
| 0 | 0 | 1 | 1 | 1 | — | 1 | — | — | 0 | 1 |
| 0 | 1 | 0 | 1 | 1 | — | 0 | — | — | 0 | 1 |
| 0 | 1 | 1 | 1 | 1 | 1 | 0 | 0 | 1 | 0 | 0 |
| 1 | 0 | 0 | 0 | 1 | — | — | — | — | 0 | 0 |
| 1 | 0 | 1 | 0 | 1 | 1 | — | 0 | 1 | 0 | 1 |
| 1 | 1 | 0 | 0 | 1 | 1 | — | 1 | 1 | 0 | 1 |
| 1 | 1 | 1 | 1 | 1 | 1 | 1 | 1 | 0 | 1 | 0 | an identical digit 0, the second multiplexor 168 provides the output of the first latch 164 as a runlength RUN1 and the output of the second latch 166 is outfitted as a runlength RUN1 if both W1 and W2 have a digit 1.

Meanwhile, a third latch 170 latches and outputs each run value coupled from the addition sector 146 in the run value calculator 140 in response to the third latch control signal LC13, the latch signal LS and the stage signal SS1. Specially, if the control signals LC13, SS1, and LS have digits 0, 1, and 0, respectively, the latch 170 latches and outputs zero. The output of the third latch 170 is supplied to a third multiplexor 172.

The third multiplexor 172 selectively provides, in response to the selection control signal S12, either a run value from the addition sector 146 or the output of the third latch 170 as a runlength RUN2 through the line L30B. That is, the selection control signal S12 has a digit 1 when all of the SS1, W1, and W2 signals are a digit 1 and, therefore, the run value from the addition sector 146 is outputted as the runlength RUN2 via the line L30B. At this time, the run value from the addition sector 146 has zero.

As illustrated above, by the operation of the runlength detection unit 30, two transform coefficients in the input data stream can be checked at the same time and the result can be provided as a runlength of the input data stream.

In the [Table 3], "-" indicates the absence of a corresponding control signal. The control signal generator 254 can be also embodied by a programmable logic array (PLA). The control signals derived at the level controller 250 are inputted to the data input circuit 220 and the level provider 230.

The data input circuit 220 contains three multiplexors 222, 224 and 226; the level provider 230 has three latches 232, 234 and 238, and two multiplexors 236 and 240.

The first multiplexor 222, in response to the first selection control signal S21, provides either an element of the SEQ1 or that of the SEQ2 to the second multiplexor 224.

The second multiplexor 224 chooses either the output of the first multiplexor 222 or the differential DC value from the intra DC processor 210 in response to the selection signal coupled thereto from the control gate 219 and then provides the selected value to the first latch 232 as a first level value. If the selection signal from the gate 219 has a digit 1, the differential DC value is selected and, if otherwise, the output of the first multiplexor 222 is chosen as the first level value.

The third multiplexor 226 selects either an element of the SEQ1 or that of the SEQ2 responsive to the second selection control signal S22 and delivers the selected value to the third latch 238 and the fifth multiplexor 240 in parallel as a second level value.

The first latch 232 latches and outputs the first level value to the second latch 234 and the fourth multiplexor 236 under the control of the first latch control signal LC21.

In response to the second latch control signal LC22, the second latch 234 latches and outputs the output of the first latch 232 to the fourth multiplexor 236.

The fourth multiplexor 236 provides, under the control of the third selection control signal S23, either the output of the first latch 232 or the second latch 234 as a level LEVEL1 via the line L40A. That is to say, the output of the first latch 232 is selected as the LEVEL1 if the S23 signal is a digit 1 and if the S23 signal has a digit 0, then that of the second latch 234 is chosen.

Meantime, in response to the third latch control signal L23, the third latch 238 latches and outputs the second level value coupled from the third multiplexor 226 in the data input circuit 220 to the fifth multiplexor 240.

The fifth multiplexor 240 selectively provides either the output of the third latch 238 or a new second level value from the third multiplexor 226 as a level LEVEL2 via the line L40B in response to the fourth selection control signal S24.

Thereafter, the two runlengths RUN1 and RUN2, and the two levels LEVEL1 and LEVEL2 derived at the runlength detection unit 30 and the level detection unit 50, respectively, are provided via the lines L30A, L30B, L40A and L40B to the run-level providing unit 70 as illustrated in FIG. 2 to be outputted as the runlength coded signal. In this apparatus, if the input data stream corresponding to an intra block is fed thereto, the size of an intra DC coefficient and a differential DC coefficient of the intra block are outputted as a first runlength and a first level for the input data stream, respectively.

In the above tables, when a control signal is represented by "-", each device utilizing the control signal does not carry out any operation based on the control signal.

The operation of the runlength coding apparatus may be more readily understood with reference to an example provided below. Assuming that the input data stream inputted to the input buffer 20 shown in FIG. 2 consists of a sequence, "0, 0, $1_1$, 0, $1_2$, $1_3$, . . . "; the counters 144-1 and 144-2 constituting the counting sector 144 of the runlength detection unit 30 are initially reset to zero; and the sequence does not include a DC coefficient, wherein $1_1$, $1_2$, and $1_3$ are non-zero values.

The sequence of input data stream is separated into an odd sequence and an even sequence such as "0, $1_1$, $1_2$, . . . " and "0, 0, $1_3$, . . . " at the input buffer 20 and each element of the odd and even sequences is provided to the runlength detection unit 30 and the level detection unit 50 as beforementioned.

The operations of the runlength detection unit 30 and the level detection unit 50 will be separately described for the convenience of explanation.

In the runlength detection unit 30, at a first clock cycle, the first coefficients 0 and 0 in the odd and even sequences are coupled to the zero value detector 110. Then, the zero value detector 110 produces the first and second write signals W1 and W2 with a digit 0 based on the first coefficients 0 and 0. Therefore, all of the control signals RST1, RST2, and SET have an identical digit 0 as shown in the [Table 1]; and current counted values C1, C2, and C3 outputted from the counting sector 144 have the values 1, 1, and 2 since the counters 144-1 and 144-2 increment previous counted values C1' and C2' by one, the C1' and C2' having been reset to zero in the initial state.

At a second clock cycle, the second coefficients $1_1$ and 0 of the odd and even sequences are coupled to the zero value detector 110. The W1 and W2 signals having digits 1 and 0, respectively, are outputted from the zero value detector 110 to the count control sector 142. Accordingly, the count control sector 142 produces the control signals SA and LS with an identical digit 0, and the addition sector 146, in response to the control signal SA, provides the sum of the previous counted values C1' and C2', i.e., 2, as a run value to the runlength provider 160, wherein the C1' and C2' are the counted values calculated at the first clock cycle. Also, at this clock cycle, since the control signals RST1, RST2, and SET have digits 1, 0, and 1, respectively, produced based on the W1 and W2 signals having digits 1 and 0, the current counted values C1, C2, and C3 outputted from the counting sector 144 have the values 0, 1, and 1.

During a third clock cycle, the third coefficients $1_2$ and $1_3$ of the odd and even sequences are transferred to the zero value detector 110 and the W1 and W2 signals having an identical digit 1 are provided to the count control sector 142. Based on the W1 and W2 signals, the count control sector 142 produces the control signals SA and LS having digits 0 and 1, and the addition sector 146 generates, in response to the control signal SA, the sum of the previous counted values C1' and C2', i.e., 1, as a run value to the runlength provider 160, wherein the C1' and C2' are the counted values derived at the second clock cycle. In this cycle, as described at the [Table 1], since the RST1, RST2, and SET signals have digits 1, 1, and 0, respectively, according to the W1 and W2 signals, the current counted values C1, C2, and C3 have the values 0, 0, and 1. The current counted values C1, C2, and C3 are selectively added and then outputted to the runlength provider 160 at a next clock in response to the SA signal to be produced based on next write signals.

According to the operation of each device in the runlength provider 160 illustrated above, when the first run value, 2, is provided from the run value calculator 140 to the runlength provider 160, the first latch 164 latches the first run value. At a next clock cycle, the first run value is latched at the second latch 166; the second run value, 1, is latched at the third latch 170; and the first latch 164 loads zero as a third run value under the control of the control signal LS having a digit 1 and coupled thereto at this clock cycle. If the run values sequentially provided from the run value calculator 140 are latched and outputted as above, the second multiplexor 168 first selects the first run value, 2, latched at the second latch 166 and provides the selected value as the runlength RUN1; and the third multiplexor 172 provides the second run value, 1, latched at the third latch 170 as the runlength RUN2. The third run value, 0, latched at the first latch 164 is outputted as a runlength together with a next runlength. That is, in the above sequence "0, 0, $1_b$, 0, $1_2$, $1_3$. . . ", the runlengths 2, 1 and 0 are produced from the runlength detection unit 30.

Meanwhile, at the level detection unit 50, the odd sequence and the even sequence such as "0, $1_1$, $1_2$, . . . " and "0, 0, $1_3$, . . . " are fed from the input buffer 20 and corresponding write signals are coupled from the runlength detection unit 30. First, when the first coefficients 0 and 0 are coupled to the first and the third multiplexors 222 and 226, the multiplexors 222 and 226 do not provide any output therethrough since the selection control signals S21 and S22 have "-" state, which are produced at the level controller 250 based on the write signals W1 and W2 having an identical digit 0. If the second coefficients 11 and 0 are fed thereto at a next clock cycle, the first multiplexor 222 selects the input value $1_1$ and the first latch 232 stores the selected value $1_1$. At another next clock cycle, if the third coefficients $1_2$ and $1_3$ are coupled thereto, the value $1_1$ is transferred to the second latch 234 and latched therein; the third multiplexor 226 chooses the value $1_2$ and provides it to the third latch 238; and the value 13 is selected by the first multiplexor 222 and latched at the first latch 232. Subsequently, the fourth multiplexor 236 supplies the value $1_1$ outputted from the second latch 234 as a first level LEVEL1 and the fifth multiplexor 240 provides the output value $1_2$ as a second level LEVEL2. However, when the level values $1_1$, $1_2$ and $1_3$ are sequentially inputted to the level detection unit 50 as the above sequence, the first level value $1_1$ and that for the level values $1_2$ and $1_3$ are simultaneously processed. Thereafter, for solving the problem, the fifth multiplexor 240 selects the level value outputted from the third multiplexor 226 and provides it as the second level LEVEL2. The level $1_3$ is outputted at a next clock cycle after the levels $1_1$ and $1_2$ are outfitted through the lines L40A and L40B. Accordingly, from the input data stream of the above sequence "0, 0, $1_1$, 0, $1_2$, $1_3$, . . . ", the levels $1_1$, $1_2$ and $1_3$ are generated at the level detection unit 50.

In the runlength detection unit 30 and the level detection unit 50, the multiplexors 162 and 224 are related to the operation of providing the intra DC coefficient. Therefore, in the above operation relative to AC coefficients, the multiplexor 162 always connects the addition sector 146 to the latch 164; and the multiplexor 224 continuously joins the multiplexor 222 to the latch 232.

The rest of the outputs of the input buffer 20 are also converted to a sequence of run-level pairs through the same or similar manner as used in the above processes.

As a result, the sequence "0, 0, $1_1$, 0, $1_2$, $1_3$, . . . " is converted to run-level pairs (2, $1_1$), (1, $1_2$), (0, $1_3$), . . . to thereby produce the runlength coded signal through the runlength coding apparatus proposed by the present invention.

While the present invention has been shown and described in connection with the preferred embodiments only, it will be readily apparent to those of ordinary skill in the art that many changes and modifications may be made without departing from the spirit and scope of the invention as defined in the appended claims.

What is claimed is:

1. An apparatus for encoding a stream of input data to generate a runlength coded signal, wherein the input data stream includes a plurality of zeros and non-zero values, which comprises:
   a buffering means for generating a first and a second sequences of the input data stream, the first and the second sequences including all of odd-numbered sequential data and all of even-numbered sequential data in the input data stream, respectively;
   a runlength detection means for providing runlengths based on the first and the second sequences and generating indicating signals by checking whether each of elements in the first and the second sequences is zero, wherein each runlength represents the number of zeros in a run of continuous zeros preceding a non-zero value in the input data stream;
   a level detection means for supplying levels based on the indicating signals and the first and the second sequences, wherein each level depicts the magnitude of the non-zero value following each run of continuous zeros in the input data stream; and
   means for providing a multiplicity of run-level pairs as the runlength coded signal based on the runlengths and levels.

2. The apparatus according to claim 1, wherein the runlength detection means includes:
   means for detecting if each of elements in the first and the second sequences is zero to thereby produce a first and a second indicating signals corresponding to said each of the elements in the first and the second sequences, respectively;
   means for generating control signals by using the first and the second indicating signals;
   means for counting, based on the first and the second indicating signals, the number of zeros in a run of continuous zeros preceding a non-zero value in the input data stream to thereby generate a plurality of run values; and
   means for latching each of the run values provided from the counting means and outputting latched run values as runlength in response to the control signals.

3. The apparatus according to claim 2, wherein the counting means includes:
   means for producing a first and a second reset control signals, a set control signal, an addition control signal, and a latch signal by using the first and the second indicating signals;
   means for generating counted values in response to the set control signal and the first and the second reset control signals; and
   means for selectively summing up the counted values under the control of the addition control signal to thereby provide the plurality of run values.

4. The apparatus according to claim 3, wherein the counted values generating means further includes:
   a first counter for generating a first counted value in response to the first reset control signal;
   a second counter for producing a second counted value responsive to the second reset control signal and the set control signal; and
   an adder for providing a third counted value by incrementing the first counted value by one.

5. The apparatus according to claim 4, wherein each of the first and the second indicating signals, W1 and W2, respectively, the first and the second reset control signals, RST1 and RST2, respectively, the set control signal, SET, the addition control signal, SA, and the latch signal, LS, is determined as:

| W1 | W2 | RST1 | RST2 | SET | SA | LS |
|----|----|------|------|-----|----|----|
| 0  | 0  | 0    | 0    | 0   | 0  | 0  |
| 0  | 1  | 1    | 1    | 0   | 1  | 0  |
| 1  | 0  | 1    | 0    | 1   | 0  | 0  |
| 1  | 1  | 1    | 1    | 0   | 0  | 1  |

6. The apparatus according to claim 5, wherein the summing up means provides, as a run value, a sum of the first and the second counted values if the addition control signal is 0, and supplies a sum of the first and the third counted values if otherwise.

7. The apparatus according to claim 3, wherein the runlength detection means includes:
   the control signals generating means containing:
      means for creating a first and a second selection control signals, a first to a third latch control signals, and a toggle signal based on a previous stage signal and the first and the second indicating signals, and
      means for producing a stage signal based on the toggle signal and the previous stage signal fed back thereto; and
   the latching and outputting means containing:
      a first storing means for latching each run value provided from the summing up means and outputting said each run value in response to the latch signal, the stage signal and the first latch control signal, a second storing means for latching the output of the first storing means and outputting said output in response to the second latch control signal,
      a third storing means for latching each run value provided from the summing up means and outputting said each run value in response to the latch signal, the stage signal, and the third latch control signal, a first selecting means for providing either of the output of the first storing means and that of the second storing means as a runlength in response to the first selection control signal, and a second selecting means for supplying in response to the second selection control signal, either of the output of the third storing means and that of the summing up means as a runlength, whereby the first and the second selecting means output two numbers of runlengths in a same clock cycle.

8. The apparatus according to claim 7, wherein the stage signal producing means includes:

a logic gate for exclusive-ORing the toggle signal and the previous stage signal fed back thereto; and means for delaying the output of the logic gate for a predetermined number of clock cycles to thereby produce the stage signal.

9. The apparatus according to claim 8, wherein each of the stage signal, SS1, the first to the third latch control signals, LC11 to LC13, respectively, the first and the second selection control signals, S11 and S12, respectively, and the toggle signal, ST1, is determined as:

| SS1 | W1 | W2 | LC11 | LC12 | LC13 | S11 | S12 | ST1 |
|-----|----|----|------|------|------|-----|-----|-----|
| 0 | 0 | 0 | — | 1 | — | 1 | 0 | 0 |
| 0 | 0 | 1 | 1 | 1 | — | — | 0 | 1 |
| 0 | 1 | 0 | 1 | 1 | — | — | 0 | 1 |
| 0 | 1 | 1 | 1 | 1 | 0 | 1 | 0 | 0 |
| 1 | 0 | 0 | 0 | 1 | — | — | 0 | 0 |
| 1 | 0 | 1 | 0 | 1 | 1 | 1 | 0 | 1 |
| 1 | 1 | 0 | 0 | 1 | 1 | 1 | 0 | 1 |
| 1 | 1 | 1 | 0 | 1 | 1 | 0 | 1 | 0 | wherein "-" indicates the absence of a corresponding control signal.

10. The apparatus according to claim 9, wherein the creating means is embodied by a programmable logic array.

11. The apparatus according to claim 1, wherein the level detection means includes:

means for producing selection control signals, and latch control signals based on the first and the second indicating signals;

a selecting means for checking each of elements in the first and the second sequences and producing a multiplicity of level values in response to the selection control signals, wherein each level value is the magnitude of the non-zero value in the first and the second sequences; and means for latching each of the level values provided from the selecting means and outputting latched level values as levels in response to the selection control signals and the latch control signals.

12. The apparatus according to claim 11, wherein the control signals producing means includes:

means for creating a first to a fourth selection control signals, a first to a third latch control signals and a toggle signal based on a previous stage signal and the first and the second indicating signals; and means for generating a stage signal based on the toggle signal and the previous stage signal fed back thereto.

13. The apparatus according to claim 12, wherein the stage signal generating means includes:

a logic gate for exclusive-ORing the toggle signal and the previous stage signal fed back thereto; and means for delaying an output of the logic gate for a predetermined time to thereby generate the stage signal.

14. The apparatus according to claim 13, wherein the selecting means includes:

a first multiplexing means for detecting a level value in each of elements in the first and the second sequences in response to the first selection control signal; and a second multiplexing means for finding a level value in each of elements in the first and the second sequences in response to the second selection control signal, to thereby enable the first and the second multiplexing means to provide different level values.

15. The apparatus according to claim 14, wherein the latching and outputting means includes:

a first storing means for latching a level value provided from the first multiplexing means and outputting it in response to the first latch control signal;

a second storing means for latching the output of the first storing means and providing the output in response to the second latch control signal;

a third storing means for latching a level value provided from the second multiplexing means and outputting it in response to the third latch control signal;

a first providing means for outputting, in response to the third selection control signal, either of the output of the first storing means and that of the second storing means as a level; and a second providing means for supplying, in response to the fourth selection control signal, either of the output of the third storing means and that of the first multiplexing means as a level, to thereby enable the first and the second providing means to output two levels in a same clock cycle.

16. The apparatus according to claim 15, wherein each of the first and the second indicating signals, W1 and W2, respectively, the stage signal, SS2, the first to the third latch control signals, LC21 to LC23, respectively, the first to the fourth selection control signals, S21 and S24, respectively, and the toggle signal, ST2, is determined as:

| SS2 | W1 | W2 | LC21 | LC22 | LC23 | S21 | S22 | S23 | S24 | ST2 |
|-----|----|----|------|------|------|-----|-----|-----|-----|-----|
| 0 | 0 | 0 | — | 1 | — | — | — | 1 | 0 | 0 |
| 0 | 0 | 1 | 1 | 1 | — | 1 | — | — | 0 | 1 |
| 0 | 1 | 0 | 1 | 1 | — | 0 | — | — | 0 | 1 |
| 0 | 1 | 1 | 1 | 1 | 1 | 0 | 0 | 1 | 0 | 0 |
| 1 | 0 | 0 | 0 | 1 | — | — | — | — | 0 | 0 |
| 1 | 0 | 1 | 0 | 1 | 1 | — | 0 | 1 | 0 | 1 |
| 1 | 1 | 0 | 0 | 1 | 1 | — | 1 | 1 | 0 | 1 |
| 1 | 1 | 1 | 1 | 1 | 1 | 1 | 1 | 0 | 1 | 0 | wherein "-" indicates the absence of a corresponding control.

17. The apparatus according to claim 16, wherein the creating means is embodied by a programmable logic array.

* * * * *